(12) United States Patent
Suzuki et al.

(10) Patent No.: US 11,289,993 B2
(45) Date of Patent: Mar. 29, 2022

(54) SWITCHING ELEMENT CONTROL CIRCUIT AND POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 113 days.

(21) Appl. No.: 16/649,662

(22) PCT Filed: Sep. 25, 2017

(86) PCT No.: PCT/JP2017/034494
§ 371 (c)(1),
(2) Date: Jul. 14, 2020

(87) PCT Pub. No.: WO2019/058545
PCT Pub. Date: Mar. 28, 2019

(65) Prior Publication Data
US 2021/0152072 A1 May 20, 2021

(51) Int. Cl.
*H03K 17/14* (2006.01)
*H02M 1/08* (2006.01)
*H03K 17/16* (2006.01)

(52) U.S. Cl.
CPC .............. *H02M 1/08* (2013.01); *H03K 17/14* (2013.01); *H03K 17/162* (2013.01)

(58) Field of Classification Search
CPC ...... H03K 17/14; H03K 17/162; H03K 17/18; H03K 17/04206; H03K 17/145; H02M 1/08; H02M 1/0029; H02M 1/0054
See application file for complete search history.

(56) References Cited

U.S. PATENT DOCUMENTS 9,030,054 B2 * 5/2015 Jacobson ............. H03K 17/127
307/115
2013/0147525 A1 6/2013 Takagiwa
2014/0077846 A1 3/2014 Taguchi et al.

FOREIGN PATENT DOCUMENTS

JP 2013-99181 A 5/2013
JP 2014-60594 A 4/2014
WO 2012/153459 A1 11/2012

OTHER PUBLICATIONS

International Search Report in PCT/JP2017/034494, dated Oct. 24, 2017. 4pp.

* cited by examiner

*Primary Examiner* — Sibin Chen
(74) *Attorney, Agent, or Firm* — Hauptman Ham, LLP

(57) ABSTRACT

A switching element control circuit: a third electrode voltage control part; a temperature detection part; a first electrode current detection part; a memory part which stores information including an initial threshold voltage and an operation temperature/first electrode current characteristic of the threshold voltage; and a threshold voltage calculation part which calculates a threshold voltage at the time of operating the switching element based on information including the initial threshold voltage, the operation temperature of the switching element, and a first electrode current, and information relating to an operation temperature/first electrode current characteristic of a threshold voltage, wherein the third electrode voltage control part controls the third electrode voltage based on a threshold voltage at the time of operating the switching element calculated by the threshold voltage calculation part.

16 Claims, 12 Drawing Sheets

SWITCHING ELEMENT CONTROL CIRCUIT AND POWER MODULE

RELATED APPLICATIONS

The present application is a National Phase of International Application Number PCT/JP2017/034494, filed Sep. 25, 2017.

TECHNICAL FIELD

The present invention relates to a switching element control circuit and a power module.

BACKGROUND ART

Conventionally, there has been known a switching element control circuit which controls an ON/OFF operation of a switching element (see patent document 1, for example).

As shown in FIG. 14, a conventional switching element control circuit 900 includes a gate voltage control part 910 which controls a gate voltage for controlling an ON/OFF operation of a switching element 800.

According to the conventional switching element control circuit 900, an ON/OFF operation of the switching element 800 can be controlled by controlling a gate voltage.

PRIOR ART DOCUMENT

Patent Document

Patent document 1: WO/2012/153459

SUMMARY OF INVENTION

Problem to be Solved by the Invention

Recently, there has been a demand for a switching element control circuit capable of reducing a switching loss by increasing a switching speed. As one of methods for realizing such a demand, a switching element control circuit is considered where a switching loss is reduced in such a manner that a turn-on period and a turn-off period are shortened by applying a gate voltage slightly exceeding a threshold voltage to a gate electrode thus increasing a switching speed (see FIG. 3A and FIG. 3B).

However, a threshold voltage at the time of operating a switching element changes from an initial threshold voltage due to a fact that an operation temperature of the switching element at the time of operating the switching element becomes higher than an operation temperature of the switching element when an initial threshold voltage (a threshold voltage at the time of shipping) is measured (an initial operation temperature), or a fact that a relatively large current is supplied to the switching element at the time of operating the switching element. Accordingly, there exists a drawback that it is difficult to shorten a turn-on period and a turn-off period by applying a voltage which slightly exceeds the threshold voltage at the time of operating the switching element to a gate electrode and hence, it is difficult to reduce a switching loss.

The present invention has been made to overcome the above-mentioned drawback, and it is an object of the present invention to provide a switching element control circuit capable of reducing a switching loss even when a threshold voltage at the time of operating a switching element changes from an initial threshold voltage. It is another object of the present invention to provide a power module provided with such a switching element control circuit.

Solution to Problem

[1] According to the present invention, there is provided a switching element control circuit for controlling an ON/OFF operation of a switching element which includes a first electrode, a second electrode, and a third electrode, the switching element control circuit including: a third electrode voltage control part which controls a third electrode voltage for controlling the ON/OFF operation of the switching element; a temperature detection part which detects an operation temperature of the switching element; a first electrode current detection part which detects a first electrode current flowing through the switching element; a memory part which stores information including an initial threshold voltage of the switching element and information relating to an operation temperature/first electrode current characteristic of a threshold voltage of the switching element; and a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature/first electrode current characteristic of the threshold voltage of the switching element, wherein the third electrode voltage control part controls the third electrode voltage based on the threshold voltage at the time of operating the switching element calculated by the threshold voltage calculation part at the time of bringing the switching element into an ON state.

[2] In the switching element control circuit according to the present invention, it is preferable that the memory part further store an initial first electrode current which flows through the switching element when the initial threshold voltage of the switching element is detected, and further store, as the information relating to the operation temperature/first electrode current characteristic of the threshold voltage of the switching element, characteristic formulae $Vth=Vth_0+\beta(Id-Id_0)$ of the first electrode current characteristics of the threshold voltages of the switching element prepared for respective predetermined operation temperatures and corresponding to the respective operation temperatures assuming that a first electrode current coefficient of the threshold voltage is $\beta$, the threshold voltage at the time of operating the switching element is $Vth$, the initial threshold voltage is $Vth_0$, the first electrode current detected by the first electrode current detection part is $Id$, and the initial first electrode current is $Id_0$ and the threshold voltage calculation part, based on the operation temperature of the switching element detected by the temperature detection part, may select the characteristic formula $Vth=Vth_0+\beta(Id-Id_0)$ of the first electrode current characteristic of the threshold voltage of the switching element corresponding to the detected operation temperature, and calculate a threshold voltage at the time of operating the switching element based on the characteristic formula, the initial threshold voltage, the initial drain current, and the first electrode current detected by the first electrode current detection part.

[3] In the switching element control circuit according to the present invention, it is preferable that the memory part further store an initial operation temperature of the switching element when the initial threshold voltage of the switching element is detected, and further store, as the information relating to the operation temperature/first electrode current characteristic of the threshold voltage of the switching element, characteristic formulae $Vth=Vth_0-\alpha(T-T_0)$ of temperature characteristics of the threshold voltages of the switching element prepared for respective predetermined first electrode currents and corresponding to the respective first electrode currents assuming that a temperature coefficient of the threshold voltage is $\alpha$, the threshold voltage at the time of operating the switching element is Vth, the initial threshold voltage is $Vth_0$, the operation temperature of the switching element detected by the temperature detection part is T, and the initial operation temperature is $T_0$, and the threshold voltage calculation part, based on the first electrode current detected by the first electrode current detection part, select the characteristic formula $Vth=Vth_0-\alpha(T-T_0)$ of the temperature characteristic of the threshold voltage of the switching element corresponding to the detected first electrode current, and calculate a threshold voltage at the time of operating the switching element based on the characteristic formula, the initial threshold voltage, the initial operation temperature and the operation temperature of the switching element detected by the temperature detection part.

[4] In the switching element control circuit according to the present invention, it is preferable that the memory part further store the initial operation temperature of the switching element and the initial first electrode current which flows through the switching element when the initial threshold voltage of the switching element is detected, and further store, as information relating to an operation temperature/first electrode current characteristic of a threshold voltage of the switching element, a characteristic formula which satisfies a relationship of $Vth=Vth_0+F(T, Id)$ assuming that the threshold voltage at the time of operating the switching element is Vth, the initial threshold voltage is $Vth_0$, and a function for correcting a threshold voltage based on an operation temperature and a first electrode current is F(T, Id), and the threshold voltage calculation part calculate a threshold voltage at the time of operating the switching element based on information including the initial operation temperature, the initial first electrode current, the operation temperature T of the switching element detected by the temperature detection part and the first electrode current detected by the first electrode current detection part and the characteristic formula which satisfies a relationship of $Vth=Vth_0+F(T, Id)$.

[5] In the switching element control circuit according to the present invention, it is preferable that the information including the initial threshold voltage and the information relating to the operation temperature/first electrode current characteristic of the threshold voltage of the switching element be stored in the memory part in advance.

[6] In the switching element control circuit according to the present invention, it is preferable that the switching element control circuit be a switching element control circuit which performs an initial threshold voltage measurement mode where the initial threshold voltage of the switching element is measured, and a control mode where the ON/OFF operation of the switching element is controlled, the switching element control circuit further include: a threshold voltage measurement power source which supplies a threshold voltage measurement current to the first electrode of the switching element; and an ON/OFF state determination part which determines an ON/OFF state of the switching element, and in the initial threshold voltage measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, and the memory part, when the ON/OFF state determination part determines that the switching element is brought into an ON state, store the third electrode voltage applied to the third electrode as the initial threshold voltage.

[7] In the switching element control circuit according to the present invention, it is preferable that the switching element control circuit be a switching element control circuit which further performs an operation temperature/first electrode current characteristic measurement mode where an operation temperature/first electrode current characteristic of a threshold voltage of the switching element is measured after the control mode is performed for a predetermined time, the switching element control circuit further include an operation temperature/first electrode current characteristic calculation part which calculates an operation temperature/first electrode current characteristic of a threshold voltage of the switching element, and in the initial threshold voltage measurement mode, the memory part, when the ON/OFF state determination part determines that the switching element is brought into an ON state, store an operation temperature of the switching element detected by the temperature detection part as an initial operation temperature, and store the first electrode current detected by the first electrode current detection part as an initial first electrode current, and in the operation temperature/first electrode current characteristic measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, the memory part, when the ON/OFF state determination part determines that the switching element is brought into an ON state, store the third electrode voltage applied to the third electrode as a characteristic measurement time threshold voltage of the switching element, and the operation temperature/first electrode current characteristic calculation part calculate the operation temperature/first electrode current characteristic of the threshold voltage of the switching element based on information including the initial threshold voltage, the initial operation temperature, the initial first electrode current, the operation temperature of the switching element detected by the temperature detection part in the operation temperature/first electrode current characteristic measurement mode, the first electrode current detected by the first electrode current detection part in the operation temperature/first electrode current characteristic measurement mode, and the characteristic measurement time threshold voltage.

[8] In the switching element control circuit according to the present invention, it is preferable that the third electrode voltage control part control the third electrode voltage such that the third electrode voltage is increased in a stepwise manner along with a lapse of time in the initial threshold voltage measurement mode.

[9] In the switching element control circuit according to the present invention, it is preferable that the third electrode voltage control part control the third electrode voltage such that the third electrode voltage becomes a pulse-like voltage which is a pulse increasing an amplitude along with a lapse of time in the initial threshold voltage measurement mode.

[10] In the switching element control circuit according to the present invention, it is preferable that the switching element control circuit be a switching element control circuit which performs an operation temperature/first electrode current characteristic measurement mode where an operation temperature/first electrode current characteristic of a threshold voltage of the switching element is measured after a control mode where an ON/OFF operation of the switching element is controlled is performed for a predetermined time, the switching element control circuit further include: a threshold voltage measurement power source which supplies a threshold voltage measurement current to the first electrode of the switching element; an ON/OFF state determination part which determines an ON/OFF state of the switching element; and an operation temperature/first electrode current characteristic calculation part which calculates the operation temperature/first electrode current characteristic of the threshold voltage of the switching element, the memory part further store an initial operation temperature of the switching element and an initial first electrode current, and in the operation temperature/first electrode current characteristic measurement mode, the third electrode voltage control part control the third electrode voltage such that the third electrode voltage is increased in a stepwise manner, the ON/OFF state determination part determine whether or not the switching element is turned on based on the first electrode current detected by the first electrode current detection part, the memory part, when the ON/OFF state determination part determines that the switching element is brought into an ON state, store an operation temperature of the switching element detected by the temperature detection part, store the first electrode current detected by the first electrode current detection part and store the third electrode voltage applied to the third electrode as a characteristic measurement time threshold voltage of the switching element, and the operation temperature/first electrode current characteristic calculation part calculate an operation temperature/first electrode current characteristic of a threshold voltage of the switching element based on information including the initial threshold voltage, the initial operation temperature, the initial first electrode current, the operation temperature of the switching element detected by the temperature detection part and the first electrode current detected by the first electrode current detection part in the operation temperature/first electrode current characteristic measurement mode, and the characteristic measurement time threshold voltage.

[11] In the switching element control circuit according to the present invention, it is preferable that the third electrode voltage control part control the third electrode voltage such that the third electrode voltage is increased in a stepwise manner along with a lapse of time in the operation temperature/first electrode current characteristic measurement mode.

[12] In the switching element control circuit according to the present invention, it is preferable that the third electrode voltage control part control the third electrode voltage such that the third electrode voltage becomes a pulse-like voltage which is a pulse increasing an amplitude along with a lapse of time in the operation temperature/first electrode current characteristic measurement mode.

[13] In the switching element control circuit according to the present invention, it is preferable that the information relating to the operation temperature/first electrode current characteristic of the threshold voltage of the switching element include data where the operation temperature of the switching element, the first electrode current, and the threshold voltage corresponding to the operation temperature and the first electrode current of the switching element, form a set.

[14] In the switching element control circuit according to the present invention, it is preferable that the switching element be a MOSFET, an IGBT or a HEMT.

[15] In the switching element control circuit according to the present invention, it is preferable that the switching element be formed using a material which contains GaN, SiC or $Ga_2O_3$.

[16] According to the present invention, there is provided a power module including: a switching element which includes a first electrode, a second electrode, and a third electrode; and the switching element control circuit which controls an ON/OFF operation of the switching element.

Advantageous Effects of Invention

According to the switching element control circuit and the power module of the present invention, the threshold voltage calculation part calculates a threshold voltage at the time of operating the switching element based on information including an operation temperature of the switching element detected by the temperature detection part and a first electrode current detected by the first electrode detection part, and the third electrode voltage control part, when the switching element is brought into an ON state, controls a third electrode voltage based on a threshold voltage at the time of operating the switching element calculated by the threshold voltage calculation part. Accordingly, even when the threshold voltage at the time of operating the switching element changes from an initial threshold voltage due to the increase of an operation temperature of the switching element at the time of operating the switching element exceeding an initial operation temperature of the switching element when an initial threshold voltage (threshold voltage at the time of shipping) is measured, or when a relatively large current flows in the switching element at the time of operating the switching element, it is possible to apply a voltage which slightly exceeds the threshold voltage at the time of operating the switching element to the gate electrode. Accordingly, a turn-on period and a turn-off period can be shortened. As a result, a switching loss can be reduced.

BRIEF DESCRIPTION OF DRAWINGS

FIG. 3A is a schematic view of a graph showing a change with time of a gate-source voltage when a gate voltage is applied to a gate electrode in a switching element control circuit according to a comparison example, and FIG. 3B is a schematic graph showing a change with time of a gate-source voltage when a gate voltage which slightly exceeds a threshold voltage is applied to a gate electrode in the switching element control circuit 100 according to the embodiment 1.

DESCRIPTION OF EMBODIMENTS

Hereinafter, a switching element control circuit and a power module according to the present invention are described based on embodiments shown in drawings. The respective drawings are schematic views, and do not always strictly reflect the actual circuit configuration and actual graphs.

Embodiment 1

1. Configuration of Power Module 1 and Switching Element Control Circuit 100 According to Embodiment 1

Figure 1:
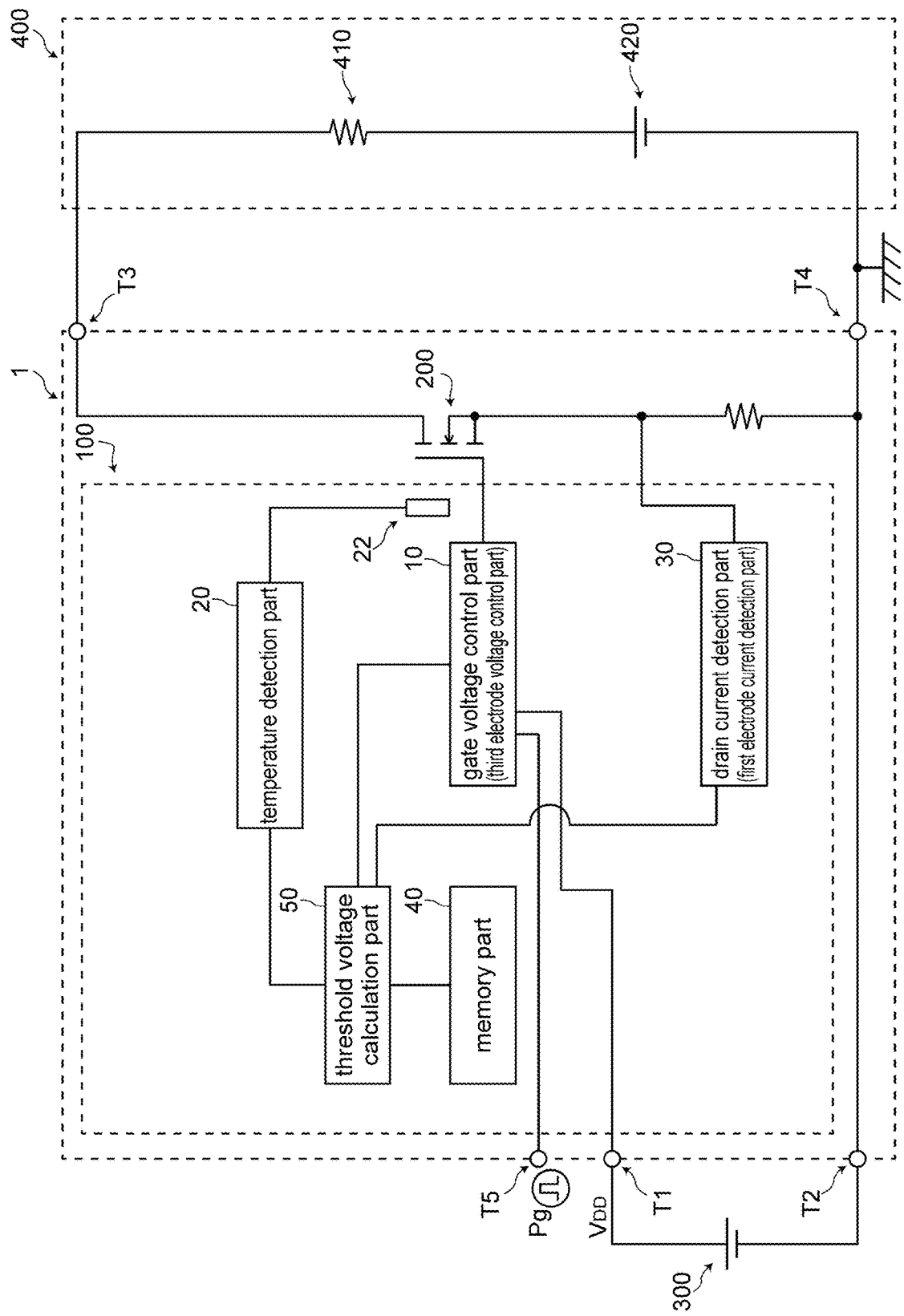
FIG. 1 is a circuit diagram showing a power module 1 and a switching element control circuit 100 according to an embodiment 1.

As shown in FIG. 1, a power module 1 according to the embodiment 1 includes: a switching element 200; and a switching element control circuit 100 according to the embodiment 1 which controls an ON/OFF operation of the switching element 200. The power module 1 according to the embodiment 1 is covered by a package formed using a resin, ceramic or the like having high heat resistance and high insulation property. The power module 1 according to the embodiment 1 includes: a (+) side input terminal T1 to which a DC power source voltage $V_{DD}$ is inputted; a (−) side input terminal T2 on a ground side, a (+) side output terminal T3; a (−) side output terminal T4 on the ground side; and a control terminal T5 to which a drive signal (for example, a gate pulse) Pg is inputted.

A gate drive power source 300 for applying a power source voltage $V_{DD}$ is connected between the (+) side input terminal T1 and the (−) side input terminal T2. The gate drive power source 300 is connected to a gate electrode of a switching element 200 via a gate voltage control part 10, and supplies a voltage to the gate electrode. A load circuit 400 is connected to the (+) side output terminal T3 and the (−) side output terminal T4. The load circuit 400 includes, for example, a load resistor 410 and a DC drive power source 420. The load resistor 410 and the DC drive power source 420 are connected in series between the (+) side output terminal T3 and the (−) side output terminal T4. The (−) side output terminal T4 is grounded.

The switching element 200 is a MOSFET which includes a source electrode (second electrode), a drain electrode (first electrode), and a gate electrode (third electrode). The switching element 200 is brought into an ON state when a gate voltage (third electrode voltage) which exceeds a threshold voltage is applied to the gate electrode, and is brought into an OFF state when the gate voltage becomes lower than the threshold voltage. The gate voltage is supplied from the power source voltage $V_{DD}$, and is controlled by the gate voltage control part 10 (third electrode voltage control part) described later. The switching element 200 is formed using a material which contains GaN. In this case, a difference between an absolute maximum rated voltage and a threshold voltage of the gate electrode becomes small.

A drain electrode of the switching element 200 is connected to the load circuit 400 via the (+) side output terminal T3. The gate electrode of the switching element 200 is connected to the gate voltage control part 10. The source electrode of the switching element 200 is connected to the (−) side output terminal T4 via a resistor.

The switching element control circuit 100 according to the embodiment 1 includes the gate voltage control part 10 (third electrode voltage control part), a temperature detection part 20, a drain current detection part 30 (first electrode current detection part), a memory part 40, and a threshold voltage calculation part 50 (see FIG. 1).

The gate voltage control part 10 is connected to the threshold voltage calculation part 50. The gate voltage control part 10 controls a gate voltage for controlling ON/OFF of the switching element 200 based on an inputted drive signal (for example, a gate pulse) Pg.

The temperature detection part 20 has a temperature detection element 22, and is connected to the threshold voltage calculation part 50. A suitable temperature detection element such as a diode or a thermistor can be used as the temperature detection element 22.

The drain current detection part 30 has a drain current detection element, and is connected to the threshold voltage calculation part 50. A resistor is used as the drain current detection element. However, a suitable current detection element such as a Rogowski coil can be also used as the drain current detection element.

The memory part 40 is connected to the threshold voltage calculation part 50. In the memory part 40, information including an initial threshold voltage $Vth_0$ of the switching element 200 (a lower limit value of a threshold voltage of the in-use switching element 200 set in advance) and an initial drain current $Id_0$ (initial first electrode current) which flows through the switching element 200 when the initial threshold voltage $Vth_0$ is measured, and information relating to an operation temperature/drain current characteristic of the threshold voltage of the switching element 200 are stored in advance. Accordingly, it is unnecessary to measure the initial threshold voltage $Vth_0$ and the initial drain current $Id_0$ after the switching element 200 is assembled to the switching element control circuit 100.

Figure 4:
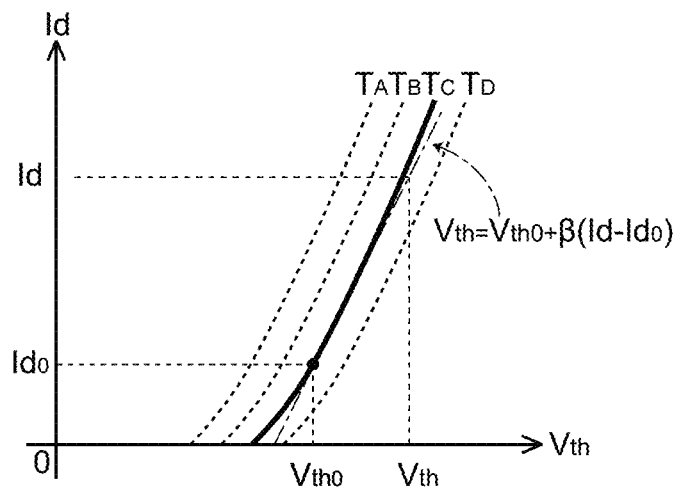
FIG. 4 is a schematic graph showing a drain current characteristic of a threshold voltage Vth of a switching element prepared for respective predetermined operation temperatures and corresponding to the respective operation temperatures in the embodiment 1.

The memory part 40 stores, as the information relating to the operation temperature/drain current characteristic of the threshold voltage of the switching element 200, characteristic formulae $Vth=Vth_0+\beta(Id-Id_0)$ of the drain current characteristics of the threshold voltages of the switching element 200 prepared for respective predetermined operation temperatures (for example, see $T_A$, $T_B$, $T_C$ and $T_D$ in FIG. 4) and corresponding to the respective operation temperatures assuming that a drain current coefficient of the threshold voltage is β, the threshold voltage at the time of operating the switching element is Vth, the initial threshold voltage is $Vth_0$, the drain current detected by the drain current detection part 30 is Id, and the initial drain current is $Id_0$.

Figure 2:
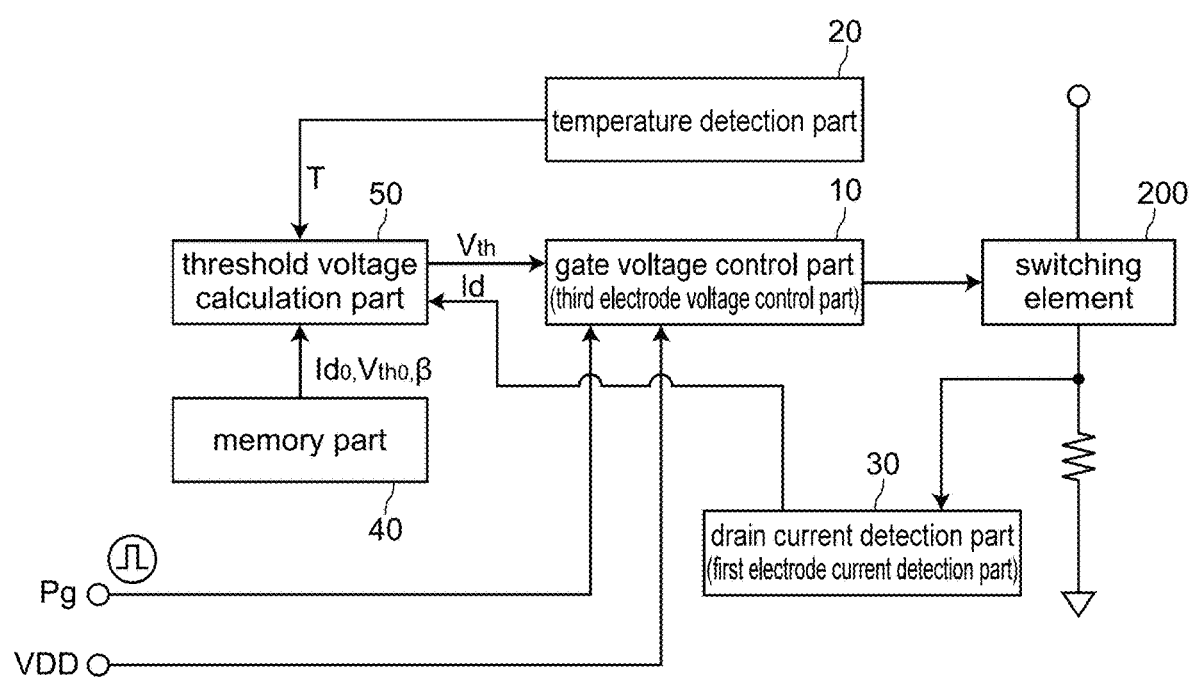
FIG. 2 is a block diagram for explaining the switching element control circuit 100 according to the embodiment 1.

When the switching element 200 is brought into an ON state, the switching element control circuit 100 according to the embodiment 1 decides a gate voltage applied to the gate electrode as follows (see FIG. 2).

First, the temperature detection part 20 detects an operation temperature T of the switching element 200 via the temperature detection element 22, and the drain current detection part 30 detects a drain current Id which flows through the switching element 200.

The threshold voltage calculation part 50, from the memory part 40, reads information including an initial threshold voltage $Vth_0$ and an initial drain current $Id_0$ of the switching element 200 and information relating to an operation temperature/drain current characteristic of a threshold voltage of the switching element 200, reads an operation temperature T of the switching element 200 from the temperature detection part 20, and reads a drain current Id which flows through the switching element 200 from the drain current detection part 30.

The threshold voltage calculation part 50, based on the operation temperature T of the switching element 200 detected by the temperature detection part 20, selects the characteristic formula $Vth=Vth_0+\beta(Id-Id_0)$ of the drain current characteristic of the threshold voltage of the switching element 200 corresponding to the selected operation temperature T (corresponding to the operation temperature Tc in FIG. 4 in the embodiment 1), and calculates a threshold voltage at the time of operating the switching element 200 based on the characteristic formula, the initial threshold voltage $Vth_0$, the initial drain current $Id_0$ and the drain current Id detected by the drain current detection part 30 (by putting the initial threshold voltage $Vth_0$ and the like into the above-mentioned characteristic formula). The drain current coefficient (first electrode coefficient) β indicates a coefficient with which a change in a drain current is converted into a change in a threshold voltage.

Figure 3A:
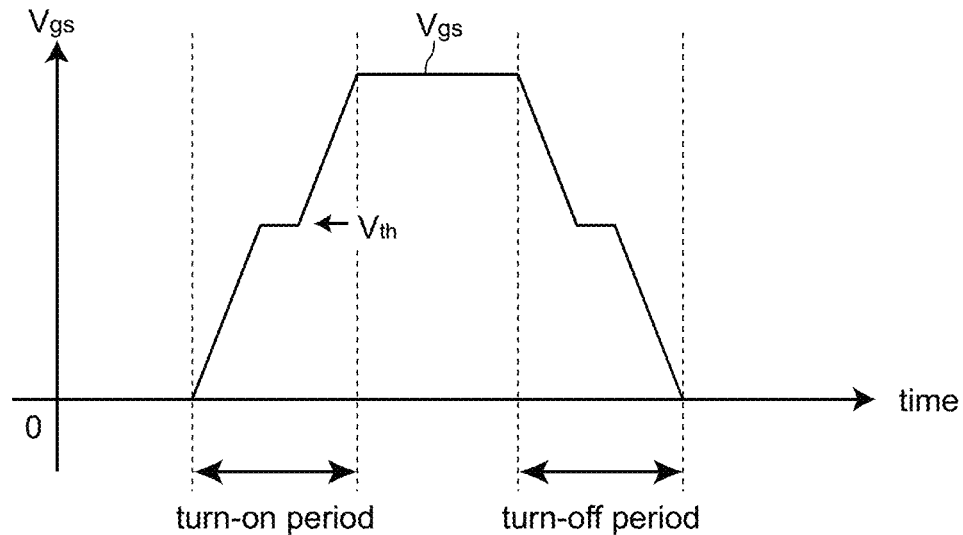
FIG. 3A and FIG. 3B are views for explaining effects when a gate voltage which slightly exceeds a threshold voltage is applied to a gate electrode.
Figure 3B:
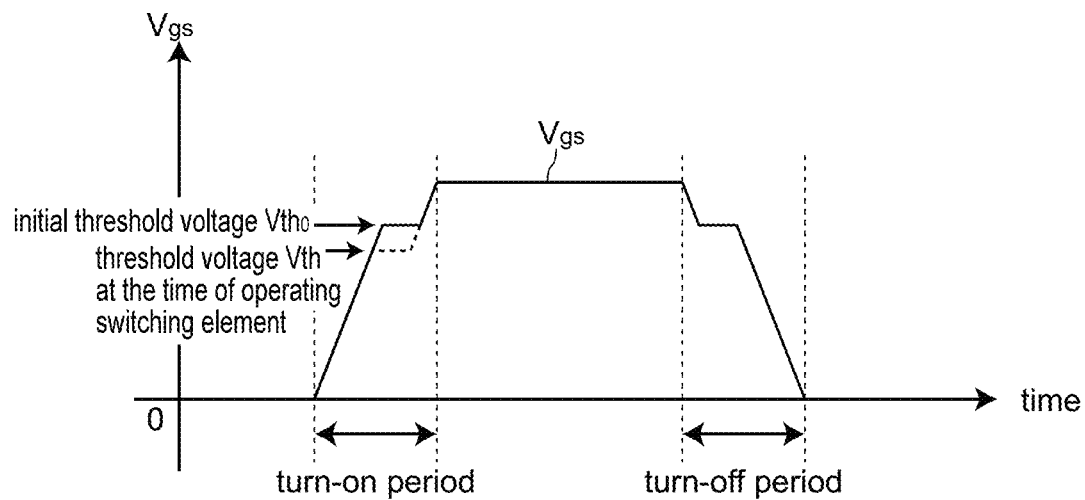

Next, the gate voltage control part 10 applies a gate voltage which slightly exceeds the threshold voltage Vth to the gate electrode based on the threshold voltage Vth at the time of operating the switching element 200 calculated by the threshold voltage calculation part 50 (see FIG. 3B). In this manner, a gate voltage applied to the gate electrode is decided.

In the switching element control circuit 100 according to the embodiment 1, a gate voltage may be constantly controlled in accordance with an operation temperature and a drain current of the switching element 200. Alternatively, a gate voltage may be controlled such that an operation temperature and a drain current of the switching element 200 are detected every predetermined time, a threshold voltage at the time of operating the switching element 200 is calculated, and the gate voltage is controlled based on the threshold voltage at the time of operating the switching element 200.

2. Advantageous Effects Acquired by Switching Element Control Circuit 100 and Power Module 1 According to Embodiment 1

According to the switching element control circuit 100 and the power module 1 of the embodiment 1, the threshold voltage calculation part 50 calculates a threshold voltage Vth at the time of operating the switching element 200 based on information including an operation temperature of the switching element 200 detected by the operation detection part 20 and a drain current detected by the drain current detection part 30, and the gate voltage control part 10, when the switching element 200 is brought into an ON state, controls a gate voltage based on the threshold voltage Vth at the time of operating the switching element 200 calculated by the threshold voltage calculation part 50. Accordingly, even when the threshold voltage Vth at the time of operating the switching element 200 changes from an initial threshold voltage $Vth_0$ due to the increase of an operation temperature of the switching element 200 at the time of operating the switching element 200 exceeding an initial operation temperature $T_0$ of the switching element 200 when the initial threshold voltage (threshold voltage at the time of shipping) is measured, or a relatively large current is made to flow into the switching element 200 at the time of operating the switching element 200, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

Further, according to the switching element control circuit 100 of the embodiment 1, the threshold voltage calculation part 50, based on the operation temperature T of the switching element 200 detected by the temperature detection part 20, selects the characteristic formula $Vth=Vth_0+\beta(Id-Id_0)$ of the drain current characteristic of the threshold voltage of the switching element 200 corresponding to the detected operation temperature T, and calculates a threshold voltage Vth at the time of operating the switching element 200 based on the characteristic formula and the drain current detected by the drain current detection part 30. Accordingly, the threshold voltage calculation part 50 can relatively easily calculate the threshold voltage Vth at the time of operating the switching element 200.

According to the switching element control circuit 100 of the embodiment 1, even when a difference between an absolute maximum rated voltage and a threshold voltage is small as in the case of the switching element formed using a material which contains GaN, a voltage which slightly exceeds a threshold voltage Vth at the time of operating the switching element can be applied to the gate electrode. Accordingly, a turn-on period and a turn-off period can be shortened. As a result, a switching loss can be reduced. Further, it is possible to prevent the occurrence of a phenomenon where the switching element 200 is not brought into an ON state even when a gate voltage which slightly exceeds a threshold voltage (a threshold voltage on design) is applied to the gate electrode. As a result, an ON/OFF operation of the switching element 200 can be controlled with certainty.

Further, according to the power module 1 of the embodiment 1, the switching element 200 is formed using a material which contains GaN. Accordingly, an ON resistance of the switching element 200 is lowered and hence, it is possible to provide a power module which exhibits a small conduction loss.

Embodiment 2

Figure 5:
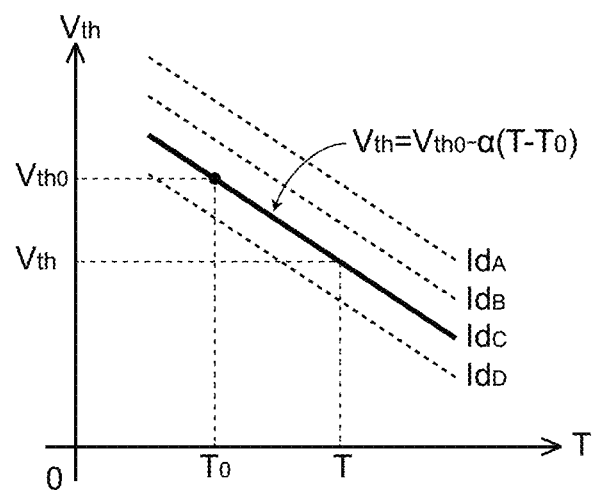
FIG. 5 is a schematic graph showing a temperature characteristic of a threshold voltage Vth of a switching element prepared for respective predetermined drain currents and corresponding to the respective drain currents in the embodiment 2.

A switching element control circuit according to an embodiment 2 has basically substantially the same configuration as the switching element control circuit 100 according to the embodiment 1. However, the switching element control circuit according to the embodiment 2 differs from the switching element control circuit 100 according to the embodiment 1 with respect to a calculation method of a threshold voltage at the time of operating the switching element 200. That is, in the switching element control circuit according to the embodiment 2, the memory part 40 further stores an initial drain current $Id_0$ which flows through the switching element 200 when an initial threshold voltage $Vth_0$ of the switching element 200 is detected and, further, stores, as information relating to an operation temperature/drain current characteristic of a threshold voltage of the switching element 200, characteristic formulae $Vth=Vth_0-\alpha(T-T_0)$ prepared for respective predetermined drain currents (for example, see $Id_A$, $Id_B$, $Id_C$ and $Id_D$ in FIG. 5) assuming that a temperature coefficient of the threshold voltage is $\alpha$, the threshold voltage at the time of operating the switching element is Vth, an initial threshold voltage is $Vth_0$, an operation temperature of the switching element 200 detected by the temperature detection part 20 is T, and the initial operation temperature is $T_0$. The threshold voltage calculation part 50, based on the drain current detected by the drain current detection part 30, selects the characteristic formula $Vth=Vth_0-\alpha(T-T_0)$ of the temperature characteristic of the threshold voltage of the switching element 200 corresponding to the detected drain current (in the embodiment 2, corresponding to the drain current $Id_C$ in FIG. 5), and calculates a threshold voltage at the time of operating the switching element 200 based on the characteristic formula and the operation temperature T of the switching element 200 detected by the temperature detection part 20 (see FIG. 5). The temperature coefficient $\alpha$ indicates a coefficient with which a change in an operation temperature of the switching element is converted into a change in a threshold voltage.

In this manner, the switching element control circuit according to the embodiment 2 differs from the case of the switching element control circuit 100 according to the embodiment 1 with respect to a calculation method of the threshold voltage at the time of operating the switching element 200. However, in the same manner as the switching element control circuit 100 according to the embodiment 1, the threshold voltage calculation part 50 calculates a threshold voltage Vth at the time of operating the switching element 200 based on information including an operation temperature of the switching element 200 detected by the temperature detection part 20 and a drain current detected by the drain current detection part 30, and the gate voltage control part 10 controls a gate voltage based on the threshold voltage Vth at the time of operating the switching element 200 calculated by the threshold voltage calculation part 50 when the switching element 200 is brought into an ON state. Accordingly, even when a threshold voltage Vth at the time of operating the switching element 200 changes from an initial threshold voltage $Vth_0$ due to increase of an operation temperature of the switching element 200 at the time of operating the switching element 200 exceeding an initial operation temperature $T_0$ of the switching element 200 when an initial threshold voltage (threshold voltage at the time of shipping) is measured or supplying of a relatively large current to the switching element 200 at the time of operating the switching element 200, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

The switching element control circuit 102 according to the embodiment 2 has substantially the same configuration as the switching element control circuit 100 according to the embodiment 1 with respect to points other than the calculation method of the threshold voltage at the time of operating the switching element 200. Accordingly, the switching element control circuit 102 according to the embodiment 2 acquires the corresponding advantageous effects found amongst all advantageous effects which the switching element control circuit 100 according to the embodiment 1 acquires.

Embodiment 3

A switching element control circuit according to the embodiment 3 (not shown in the drawing) has basically substantially the same configuration as the switching element control circuit 100 according to the embodiment 1. However, the switching element control circuit according to the embodiment 3 differs from the switching element control circuit 100 according to the embodiment 1 in a calculation method of a threshold voltage at the time of operating the switching element 200. That is, in the switching element control circuit according to the embodiment 3, the memory part 40 further stores an initial operation temperature $T_0$ of the switching element 200 and an initial drain current $Id_0$ which flows through the switching element 200 when an initial threshold voltage $Vth_0$ of the switching element 200 is detected, and stores, as information relating to an operation temperature/drain current characteristic of a threshold voltage of the switching element 200, a characteristic formula which satisfies a relationship of $Vth=Vth_0+F(T, Id)$ assuming that a threshold voltage at the time of operating the switching element 200 is Vth, an initial threshold voltage is $Vth_0$, and a function for correcting a threshold voltage based on an operation temperature and a drain current is $F(T, Id)$.

The function $F(T, Id)$ for correcting a threshold voltage based on an operation temperature and a drain current is a function of an operation temperature T and a drain current Id of the switching element 200, and a correction amount from an initial threshold voltage $Vth_0$ can be calculated by putting an initial operation temperature $T_0$, an initial drain current $Id_0$, an operation temperature T of the switching element 200 at the time of operating the switching element 200 and a drain current Id which flows through the switching element 200 at the time of operating the switching element 200. The function $F(T, Id)$ may be expressed as follows, for example.

$$F(T,Id)=-\alpha(T-T_0)+\beta(Id-Id_0).$$

In this manner, the switching element control circuit according to the embodiment 3 differs from the case of the switching element control circuit 100 according to the embodiment 1 with respect to a calculation method of a threshold voltage at the time of operating the switching element 200. However, in the same manner as the switching element control circuit 100 according to the embodiment 1, the threshold voltage calculation part 50 calculates a threshold voltage Vth at the time of operating the switching element 200 based on information including an operation temperature of the switching element 200 detected by the temperature detection part 20 and a drain current detected by the drain current detection part 30, and the gate voltage control part 10 controls a gate voltage based on the threshold voltage Vth at the time of operating the switching element 200 calculated by the threshold voltage calculation part 50 when the switching element 200 is brought into an ON state.

Accordingly, even when the threshold voltage Vth at the time of operating the switching element 200 changes from an initial threshold voltage $Vth_0$ due to increase of an operation temperature of the switching element 200 at the time of operating the switching element 200 exceeding an initial operation temperature $T_0$ of the switching element 200 when the initial threshold voltage (threshold voltage at the time of shipping) is measured or supplying of a relatively large current to the switching element 200 at the time of operating the switching element 200, it is possible to apply a voltage which slightly exceeds the threshold voltage Vth at the time of operating the switching element 200 to the gate electrode. Accordingly, a turn-on period and a turn-off period can be shortened. As a result, a switching loss can be reduced.

Further, according to the switching element control circuit according to the embodiment 3, the memory part 40, as the information relating to an operation temperature/first electrode current characteristic of a threshold voltage of the switching element, stores a characteristic formula which satisfies the relationship of $Vth=Vth_0+F(T, Id)$. Accordingly, it is possible to calculate a threshold voltage (at the time of operating the switching element 200) by more accurately taking an operation temperature T of the switching element 200 and a drain current Id into consideration.

The switching element control circuit according to the embodiment 3 has substantially the same configuration as the switching element control circuit 100 according to the embodiment 1 with respect to points other than a calculation method of the threshold voltage at the time of operating the switching element 200. Accordingly, the switching element control circuit according to the embodiment 3 acquires the corresponding advantageous effects found amongst all advantageous effects which the switching element control circuit 100 according to the embodiment 1 acquires.

Embodiment 4

Figure 6:
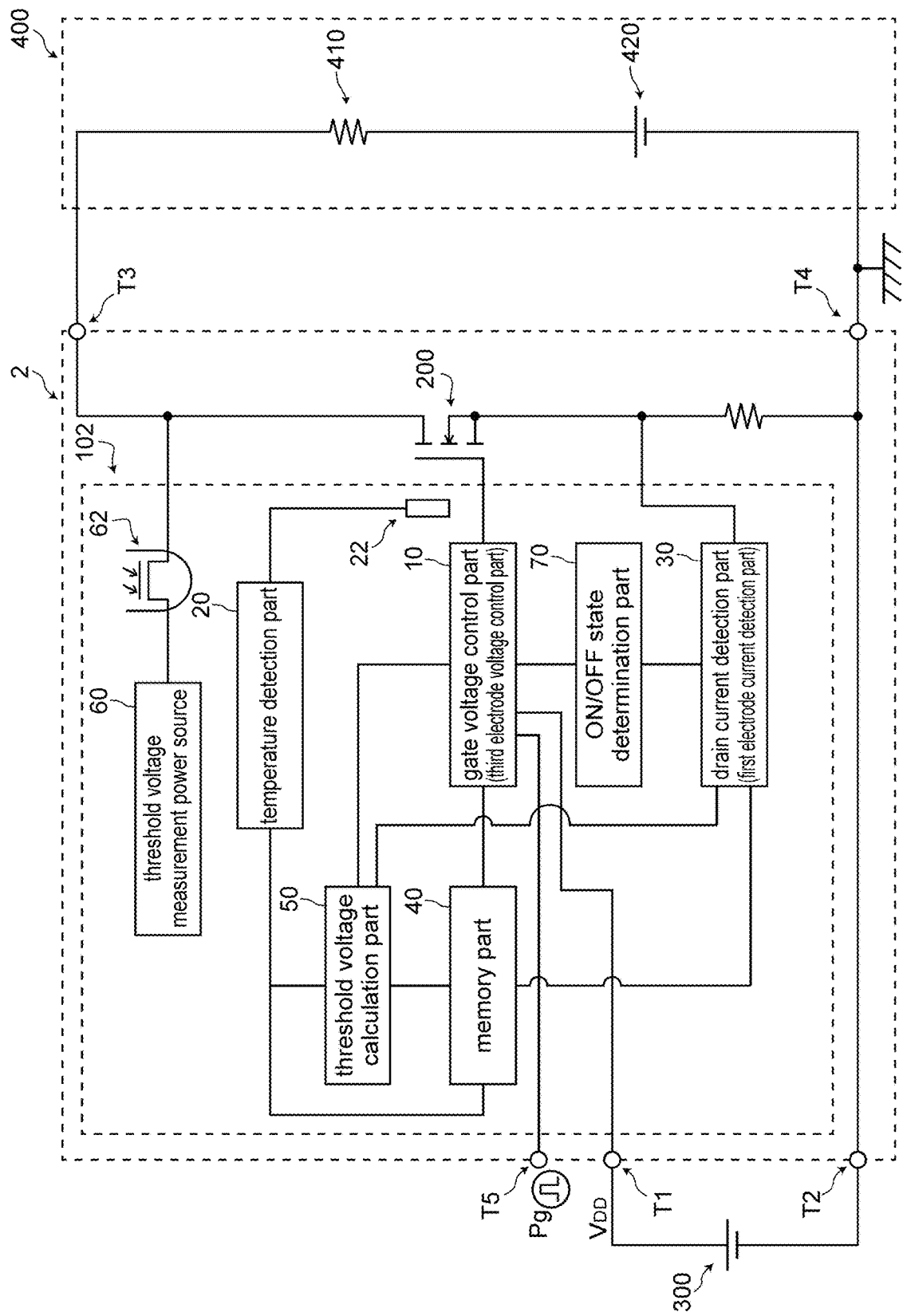
FIG. 6 is a circuit diagram showing a power module 2 and a switching element control circuit 102 according to an embodiment 4.

A switching element control circuit 102 according to the embodiment 4 has basically substantially the same configuration as the switching element control circuit according to the embodiment 1. However, the switching element control circuit 102 according to the embodiment 4 differs from the switching element control circuit 100 according to the embodiment 1 with respect to a point that the switching element control circuit 102 further includes a threshold voltage measurement power source and an ON/OFF state determination part. That is, the switching element control circuit 102 according to the embodiment 4 is a switching element control circuit which changes a mode between an initial threshold voltage measurement mode where an initial threshold voltage $Vth_0$ of a switching element 200 is measured and a control mode where an ON/OFF operation of the switching element 200 is controlled (see FIG. 6).

A threshold voltage measurement power source 60 is connected to a drain electrode of the switching element 200. In the initial threshold voltage measurement mode, the threshold voltage measurement power source 60 supplies an electric current for a threshold voltage measurement to a drain electrode (first electrode) of the switching element 200 by turning on a threshold voltage measurement switch 62.

As the threshold voltage measurement switch 62, a suitable switch can be used. For example, a photocoupler can be used.

In the initial threshold voltage measurement mode, the ON/OFF state determination part 70 determines an ON/OFF state of the switching element 200 based on a detection result received from the drain current detection part 30. The ON/OFF state determination part 70 is connected to the drain current detection part 30 and a gate voltage control part 10.

The gate voltage control part 10 is connected not only to the ON/OFF state determination part 70 and the threshold voltage calculation part 50 but also to the memory part 40.

The switching element control circuit 102 according to the embodiment 4 is operated as follows.

(1) Initial Threshold Voltage Measurement Mode

The initial threshold voltage measurement mode is a mode where an initial threshold voltage $Vth_0$ of the switching element 200 connected to the switching element control circuit 100 is measured. This mode is performed before the switching element control circuit 102 and the switching element 200 are driven.

Figure 7:
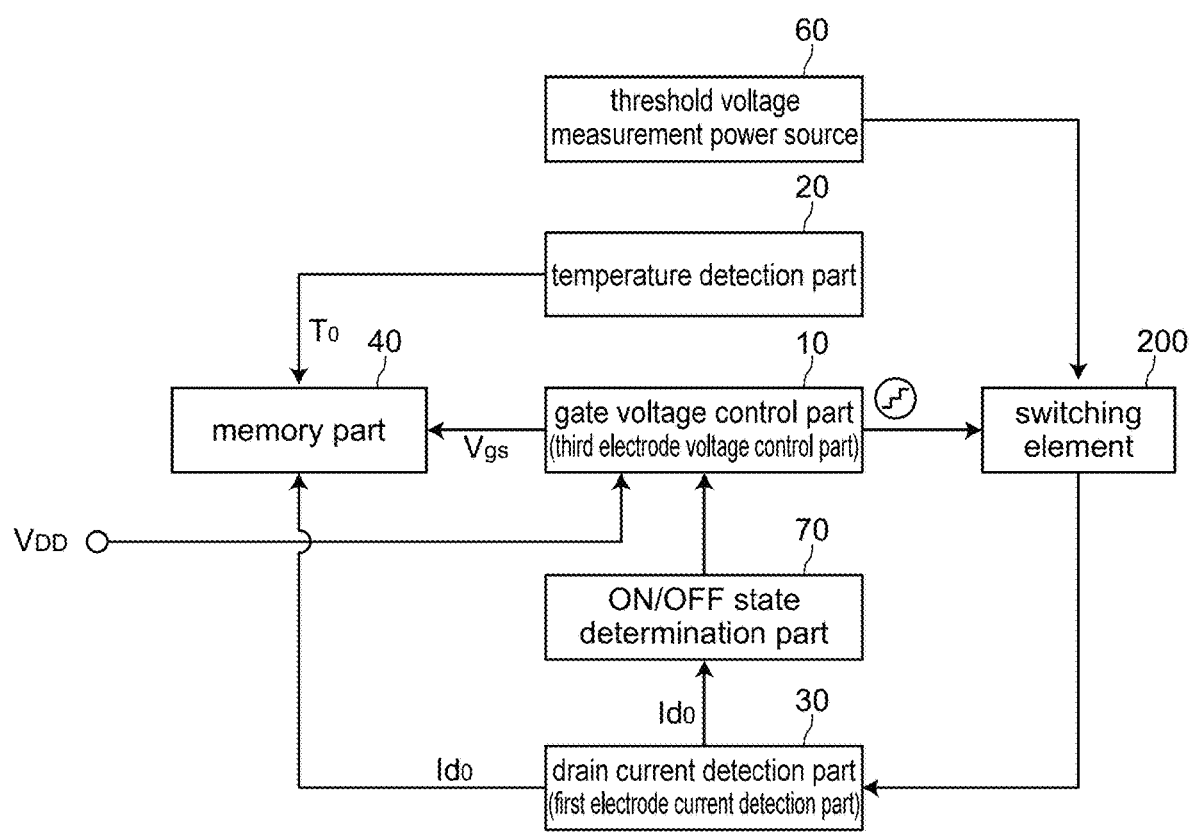
FIG. 7 is a block diagram for explaining an initial threshold voltage measurement mode of the switching element control circuit 102 according to the embodiment 4.

First, in a state where an electric current is not supplied from a drive power source 420, an electric current for the threshold voltage measurement is supplied to the drain electrode of the switching element 200 from the threshold voltage measurement power source 60 (see FIG. 7).

Figure 8:
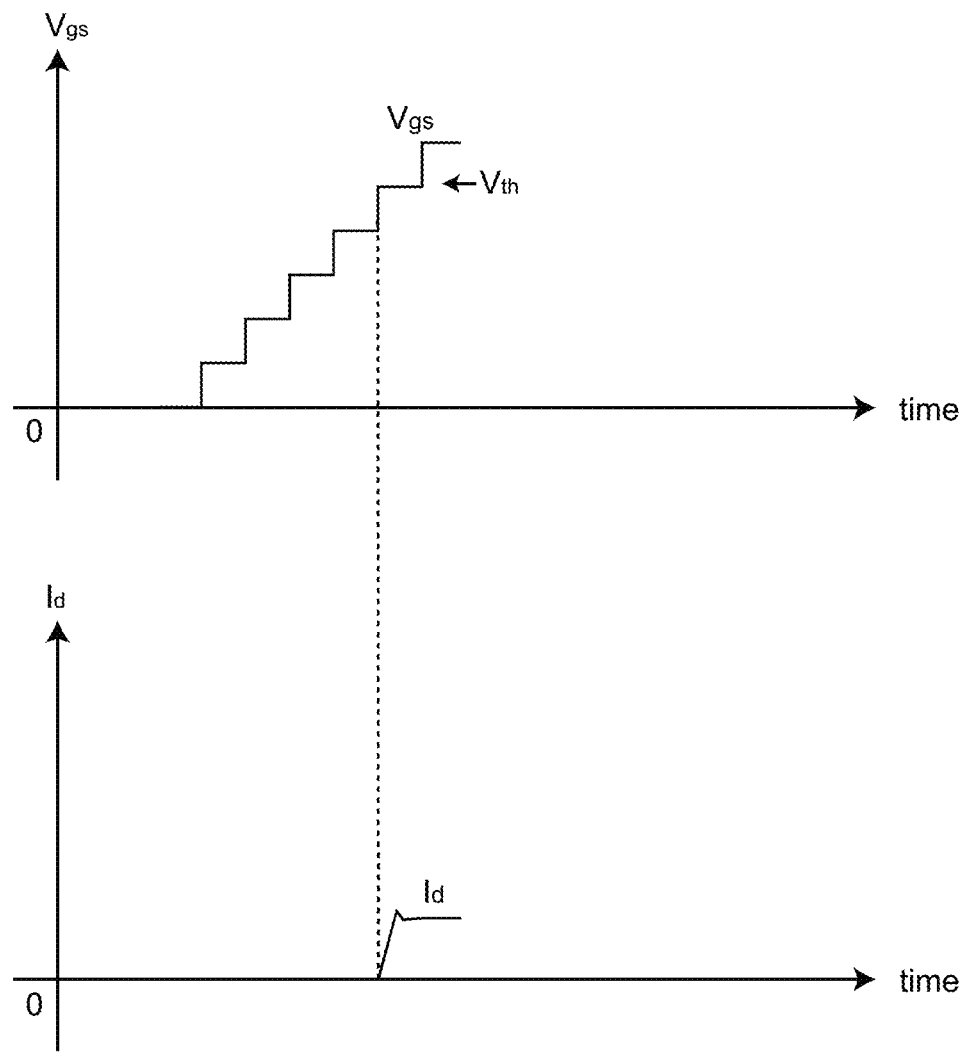
FIG. 8 is a schematic view of a graph of a gate-source voltage for explaining the initial threshold voltage measurement mode in the embodiment 4.

Next, the gate voltage control part 10 controls a gate voltage such that a voltage lower than an estimated initial threshold voltage is applied to the gate electrode. At this stage of operation, a drain current is not detected by the drain current detection part 30 (a value of the drain current being 0) and hence, the ON/OFF state determination part 70 determines that the switching element 200 is in an OFF state. When the ON/OFF state determination part 70 determines that the switching element 200 is in an OFF state, the gate voltage control part 10 controls the gate voltage such that the gate voltage is increased by one stage (see FIG. 8).

The gate voltage is increased in a stepwise manner (to be more specific, increased in a step-like manner) by repeating such an operation. When a drain current is detected by the drain current detection part 30 (when the drain current takes a value other than 0), the ON/OFF state determination part 70 determines that the switching element 200 is in an ON state (see FIG. 7). At this stage of operation, a drain current flowing through the switching element 200 which is detected by the drain current detection part 30 is transmitted to the memory part 40, and the gate voltage control part 10 transmits a gate voltage Vgs applied to the gate electrode to the memory part 40. Then, the memory part 40 stores the drain current as an initial drain current $Id_0$, and stores the gate voltage Vgs as an initial threshold voltage $Vth_0$. In this case, an operation temperature of the switching element 200 detected by the temperature detection part 20 may be transmitted to the memory part 40, and the memory part 40 may store such an operation temperature as an initial operation temperature $T_0$.

(2) Control Mode

In the control mode, when the switching element is brought into an ON state, the threshold voltage calculation part 50 calculates a threshold voltage Vth at the time of operating the switching element based on an initial threshold voltage $Vth_0$ and an initial drain current $Id_0$ measured in the initial threshold voltage measurement mode, an operation temperature T of the switching element 200 detected by the temperature detection part 20, a drain current Id flowing through the switching element 200 which is detected by the drain current detection part 30, and information relating to an operation temperature/drain current characteristic of a threshold voltage of the switching element, and the gate voltage control part 10 applies a gate voltage which slightly exceeds a threshold voltage Vth at the time of operating the switching element which is calculated by the threshold voltage calculation part 50 to the gate electrode (see FIG. 3B).

The switching element control circuit 102 according to the embodiment 4 is also applicable to the case of the calculation method of a threshold voltage at the time of operating the switching element in the embodiment 2. In this case, the memory part 40 stores, in place of an initial drain current $Id_0$, an initial operation temperature $T_0$ at which it is determined that the switching element 200 is brought into an ON state. The switching element control circuit 102 according to the embodiment 4 is also applicable to the case of the calculation method of a threshold voltage at the time of operating the switching element in the embodiment 3. In this case, the memory part 40 stores, in addition to the initial drain current $Id_0$, the initial operation temperature $T_0$ at which it is determined that the switching element 200 is brought into an ON state.

In this manner, the switching element control circuit 102 according to the embodiment 4 differs from the case of the switching element control circuit 100 according to the embodiment 1 with respect to the point that the switching element control circuit 102 further includes the threshold voltage measurement power source and the ON/OFF state determination part. However, in the same manner as the switching element control circuit 100 according to the embodiment 1, the threshold voltage calculation part 50 calculates a threshold voltage Vth at the time of operating the switching element 200 based on information including an operation temperature of the switching element 200 detected by the temperature detection part 20 and a drain current detected by the drain current detection part 30, and the gate voltage control part 10 controls a gate voltage based on the threshold voltage Vth at the time of operating the switching element 200 calculated by the threshold voltage calculation part 50 when the switching element 200 is brought into an ON state. Accordingly, even when the threshold voltage Vth at the time of operating the switching element 200 changes from an initial threshold voltage $Vth_0$ due to increase of an operation temperature of the switching element 200 at the time of operating the switching element 200 exceeding an initial operation temperature $T_0$ of the switching element 200 when the initial threshold voltage (threshold voltage at the time of shipping) is measured or supplying of a relatively large current to the switching element 200 at the time of operating the switching element 200, it is possible to apply a voltage which slightly exceeds the threshold voltage at the time of operating the switching element 200 to the gate electrode. Accordingly, a turn-on period and a turn-off period can be shortened. As a result, a switching loss can be reduced.

Further, according to the switching element control circuit 102 and the power module 2 according to the embodiment 4, in an initial threshold voltage measurement mode, an actual threshold voltage of the switching element 200 which is actually connected to the switching element control circuit 102 can be measured. Accordingly, even in the case where an actual threshold voltage changes from a threshold voltage on design due to irregularities in manufacture of the switching element 200, when the switching element 200 is brought into an ON state, it is possible to apply a gate voltage which slightly exceeds an actual threshold voltage to the gate electrode of the switching element 200 based on the actual threshold voltage. Accordingly, compared to a case where a gate voltage which largely exceeds a threshold voltage is applied to the gate electrode of the switching element 200 for controlling an ON/OFF operation of the switching element 200 with certainty (comparison example, see FIG. 3A), a turn-on period and a turn-off period can be shortened in this embodiment 4. Accordingly, a switching speed of the switching element 200 can be increased. As a result, a switching loss of the switching element 200 can be reduced.

Further, according to the switching element control circuit 102 and the power module 2 of the embodiment 4, as described previously, when the switching element 200 is brought into an ON state, a gate voltage which slightly exceeds an actual threshold voltage can be applied to the gate electrode based on the actual threshold voltage. Accordingly, even in the case where an actual threshold voltage changes such that the actual threshold voltage becomes higher than a threshold voltage on design due to irregularities in manufacture of the switching element 200, it is possible to apply a gate voltage which slightly exceeds an actual threshold voltage to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Particularly, even in the case where a difference between an absolute maximum rated voltage of the gate electrode and a threshold voltage is small as in the case where the switching element 200 is formed using a material which contains GaN, a gate voltage which slightly exceeds an actual threshold voltage can be applied to the gate electrode. Accordingly, it is possible to prevent the occurrence of a phenomenon where the switching element 200 is not brought into an ON state even when the gate voltage which slightly exceeds a threshold voltage (threshold voltage on design) is applied to the gate electrode. As a result, an ON/OFF operation of the switching element 200 can be controlled with certainty.

Further, according to the switching element control circuit 102 and the power module 2 of the embodiment 4, in an initial threshold voltage measurement mode, an actual threshold voltage can be measured, and in a control mode, when the switching element is brought into an ON state, a gate voltage applied to the gate electrode can be controlled based on information including an actual threshold voltage. Accordingly, even when the switching elements 200 are manufactured on a mass production basis, it is unnecessary to measure a threshold voltage of each manufactured switching element before the switching element 200 is connected to the switching element control circuit 102. Accordingly, a measurement operation does not become cumbersome and hence, productivity can be easily enhanced.

Further, according to the switching element control circuit 102 of the embodiment 4, the gate voltage control part 10 controls a gate voltage such that the gate voltage is increased in a step-like manner along with a lapse of time in an initial threshold voltage measurement mode. Accordingly, it is possible to measure a threshold voltage of the switching element 200 efficiently and with certainty.

The switching element control circuit 102 according to the embodiment 4 has substantially the same configuration as the switching element control circuit 100 according to the embodiment 1 with respect to points other than the point that the switching element control circuit 102 further includes the threshold voltage measurement power source and the ON/OFF state determination part. Accordingly, the switching element control circuit 102 according to the embodiment 4 acquires the corresponding advantageous effects found amongst all advantageous effects which the switching element control circuit 100 according to the embodiment 1 acquires.

Embodiment 5

A switching element control circuit 104 according to the embodiment 5 has basically substantially the same configuration as the switching element control circuit 102 according to the embodiment 4. However, the switching element control circuit 104 according to the embodiment 5 differs from the switching element control circuit 102 according to the embodiment 4 with respect to a point that the switching element control circuit 104 according to the embodiment 5 further includes an operation temperature/drain current characteristic calculation part (operation temperature/first electrode current characteristic calculation part). The switching element control circuit 104 according to the embodiment 5 is a switching element control circuit which performs an operation temperature/drain current characteristic measurement mode (operation temperature/first electrode current characteristic measurement mode, hereinafter, simply referred to as characteristic measurement mode) where an operation temperature/drain current characteristic of a threshold voltage of a switching element 200 is measured after a control mode is performed for a predetermined time.

Figure 9:
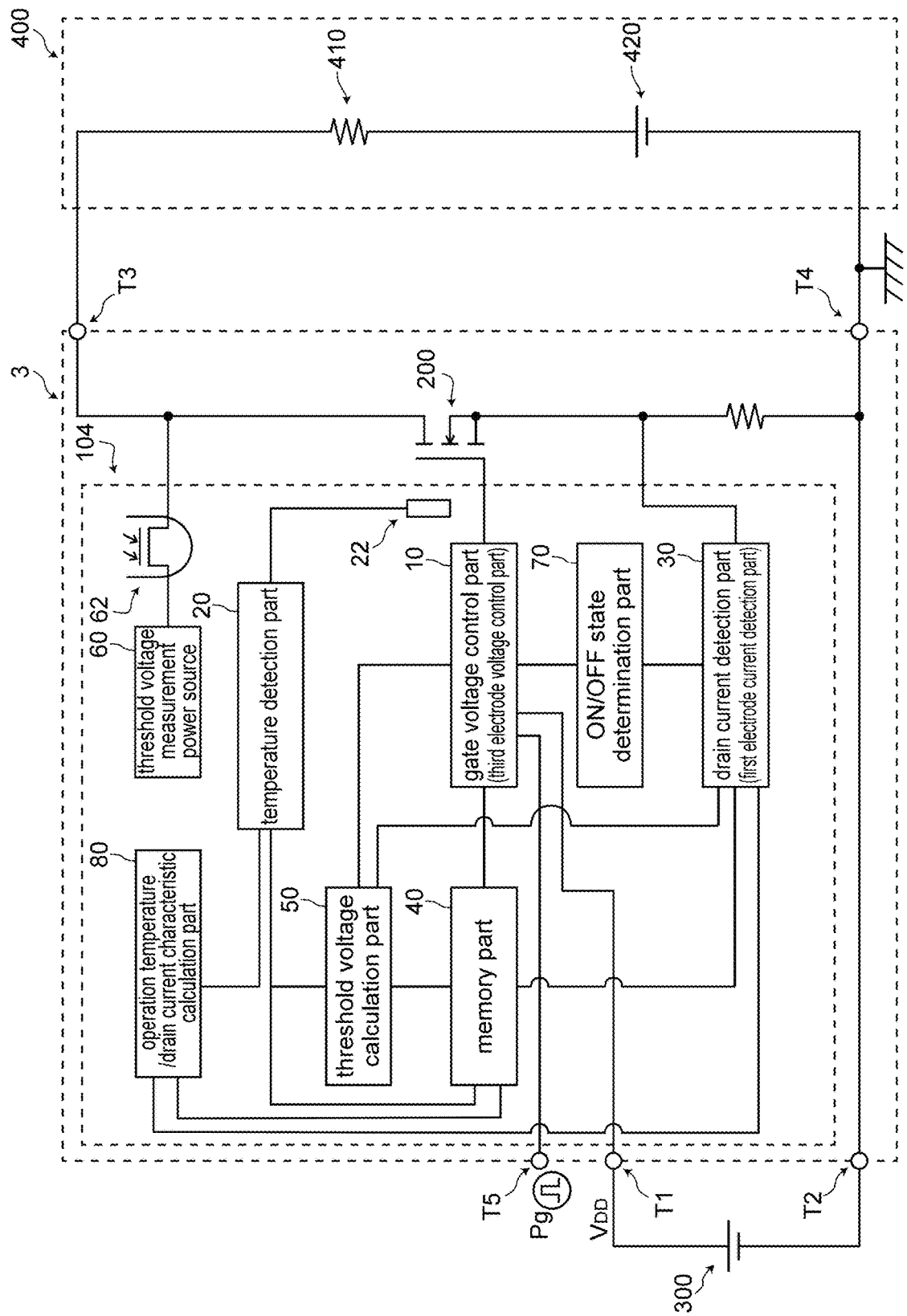
FIG. 9 is a circuit diagram showing a power module 3 and a switching element control circuit 104 according to an embodiment 5.

An operation temperature/drain current characteristic calculation part 80 is connected to a temperature detection part 20, a drain current detection part 30 and a memory part 40 (see FIG. 9 and FIG. 10), and calculates an operation temperature/drain current characteristic of a threshold voltage of the switching element 200.

In the characteristic measurement mode, the following operations are performed.

Figure 10:
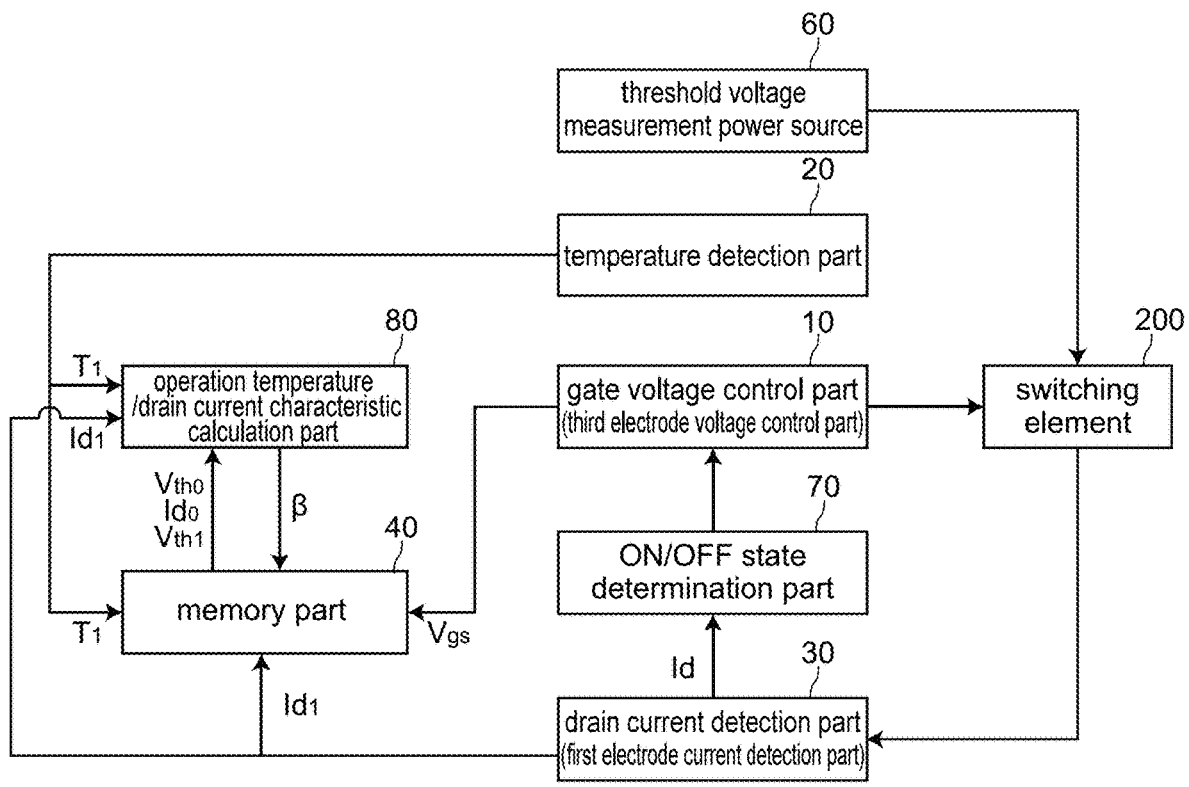
FIG. 10 is a block diagram for explaining an operation temperature/drain current characteristic measurement mode in the embodiment 5.

After the control mode is performed for a predetermined time, an electric current for a threshold voltage measurement is supplied to a drain electrode of the switching element 200 from a threshold voltage measurement power source 60 in a state where an electric current is not supplied from a drive power source 420 (see FIG. 10).

Next, a gate voltage control part 10 controls a gate voltage such that a voltage lower than an estimated threshold voltage (at the time of operating the switching element 200) is applied to the gate electrode. At this stage of operation, a drain current is not detected by a drain current detection part 30 (a value of the drain current being 0) and hence, an ON/OFF state determination part 70 determines that the switching element 200 is in an OFF state. When the ON/OFF state determination part 70 determines that the switching element 200 is in an OFF state, the gate voltage control part 10 controls the gate voltage such that the gate voltage is increased by one stage (see FIG. 8).

The gate voltage is increased in a stepwise manner (to be more specific, increased in a step-like manner) by repeating such an operation. When a drain current is detected by the drain current detection part 30 (when the drain current takes a value other than 0), the ON/OFF state determination part 70 determines that the switching element 200 is in an ON state. At this stage of operation, an operation temperature $T_1$ of the switching element 200 detected by the temperature detection part 20 and a drain current $Id_1$ detected by the drain current detection part 30 which flows through the switching element 200 are transmitted to the memory part 40, and are stored in the memory part 40. Further, the gate voltage control part 10 transmits a gate voltage Vgs applied to the gate electrode to the memory part 40 as a characteristic measurement time threshold voltage $Vth_1$, and the memory part 40 stores the gate voltage Vgs as the characteristic measurement time threshold voltage $Vth_1$.

Figure 11:
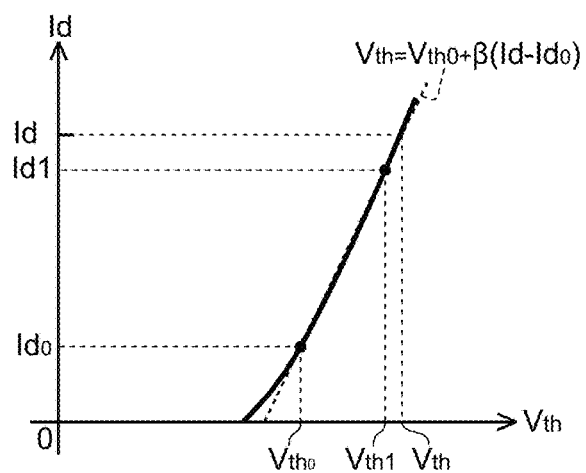
FIG. 11 is a schematic view of a graph showing a relationship between the threshold voltage Vth and the drain current Id of the switching element in the switching element control circuit according to the embodiment 5.

Next, the operation temperature/drain current characteristic calculation part 80 reads information including an initial threshold voltage $Vth_0$, an initial operation temperature $T_0$, an initial drain current $Id_0$, and a characteristic measurement time threshold voltage $Vth_1$ from the memory part 40. Further, in a characteristic measurement mode, the drain current characteristic calculation part 80 reads a drain current $Id_1$ detected by the drain current detection part 30 and an operation temperature $T_1$ detected by a temperature detection part 20, and calculates an operation temperature/drain current characteristic (for example, a drain current coefficient β, see FIG. 11). The calculated operation temperature/drain current characteristic is stored in the memory part 40.

In a control mode, a threshold voltage calculation part 50 calculates a threshold voltage Vth based on an operation temperature/drain current characteristic calculated in the characteristic measurement mode, a drain current Id which flows through the switching element 200 detected by the drain current detection part 30 at the time of operating the switching element 200, an initial threshold voltage $Vth_0$ and an initial drain current $Id_0$ stored in the memory part 40, and the gate voltage control part 10 controls a gate voltage based on the threshold voltage Vth.

Figure 12:
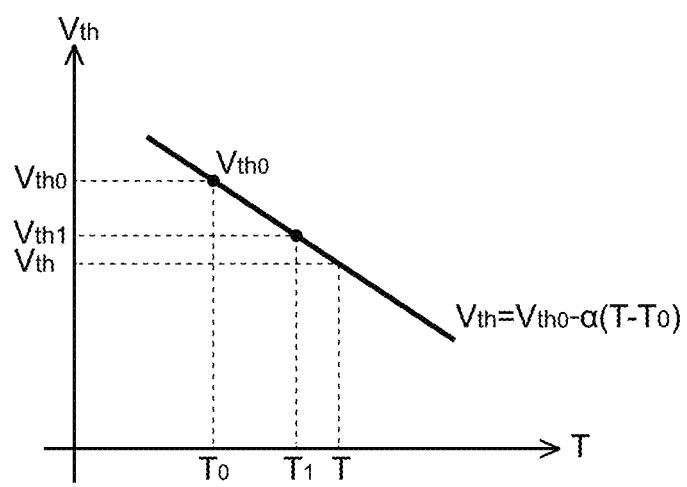
FIG. 12 is a schematic view of a graph showing a relationship between the threshold voltage Vth and the operation temperature T of the switching element in the switching element control circuit according to the embodiment 5.

The switching element control circuit 104 according to the embodiment 5 is also applicable to the case of the calculation method of a threshold voltage at the time of operating the switching element in the embodiment 2. In this case, an operation temperature/drain current characteristic calculation part 80 calculates a temperature coefficient α in place of a drain current coefficient β (see FIG. 12). Further, the switching element control circuit 104 according to the embodiment 5 is also applicable to the case of the calculation method of a threshold voltage at the time of operating the switching element in the embodiment 3. The operation temperature/drain current characteristic calculation part 80 calculates the drain current coefficient β and the temperature coefficient α (see FIG. 11 and FIG. 12).

In this manner, the switching element control circuit 104 according to the embodiment 5 differs from the case of the switching element control circuit 102 according to the embodiment 4 with respect to the point that the switching element control circuit 104 further includes the operation temperature/drain current characteristic calculation part. However, in the same manner as the switching element control circuit 102 according to the embodiment 4, the threshold voltage calculation part 50 calculates a threshold voltage Vth at the time of operating the switching element 200 based on the information including the operation temperature of the switching element 200 detected by the temperature detection part 20 and the drain current detected by the drain current detection part 30, and the gate voltage control part 10 controls the gate voltage based on the threshold voltage Vth at the time of operating the switching element 200 calculated by the threshold voltage calculation part 50 when the switching element 200 is brought into an ON state. Accordingly, even when the threshold voltage Vth at the time of operating the switching element 200 changes from an initial threshold voltage $Vth_0$ due to increase of the operation temperature of the switching element 200 at the time of operating the switching element 200 exceeding the initial operation temperature $T_0$ of the switching element 200 when the initial threshold voltage (threshold voltage at the time of shipping) is measured or supplying of a relatively large current to the switching element 200 at the time of operating the switching element 200, it is possible to apply a voltage which slightly exceeds the threshold voltage at the time of operating the switching element 200 to the gate electrode. Accordingly, a turn-on period and a turn-off period can be shortened. As a result, a switching loss can be reduced.

Further, according to the switching element control circuit 104 of the embodiment 5, the switching element control circuit 104 includes the operation temperature/drain current characteristic calculation part 80 and hence, the switching element control circuit 104 calculates operation temperature/drain current characteristics based on threshold voltages measured at different operation temperatures and at different drain currents of the switching element 200 (that is, threshold voltages measured at a plurality of points) Accordingly, even in the case where a drain current characteristic of a switching element actually connected to the switching element control circuit changes from a drain current characteristic on design due to irregularities in the manufacture of the switching elements, it is possible to calculate more accurately an operation temperature/drain current characteristic of a threshold voltage of the switching element. As a result, it is possible to apply a gate voltage which slightly exceeds an actual threshold voltage to the gate electrode.

The switching element control circuit 104 according to the embodiment 5 has substantially the same configuration as the switching element control circuit 102 according to the embodiment 4 with respect to points other than the point that the switching element control circuit 104 according to the embodiment 5 further includes the operation temperature/drain current characteristic calculation part. Accordingly, the switching element control circuit 104 according to the embodiment 5 acquires the corresponding advantageous effects found amongst all advantageous effects which the switching element control circuit 102 according to the embodiment 4 acquires.

Although the present invention has been described based on the above-mentioned embodiments, the present invention is not limited to the above-mentioned embodiments. The present invention can be carried out in various modes without departing from the gist of the present invention and, for example, the following modifications are also conceivable.

(1) The numbers and the like of the constitutional elements described in the above-mentioned embodiments are provided for an exemplifying purpose, and can be changed within a scope where advantageous effects of the present invention are not impaired.

(2) In the above-mentioned embodiment 5, the switching element control circuit is a switching element control circuit which performs the initial threshold voltage measurement mode, the operation temperature/drain current characteristic measurement mode, and the control mode. However, the present invention is not limited to such a configuration. For example, a switching element control circuit which performs only the operation temperature/drain current characteristic measurement mode and the control mode may be adopted. In this case, an initial threshold voltage, an initial operation temperature and an initial drain current are stored in a memory part in advance.

Figure 13:
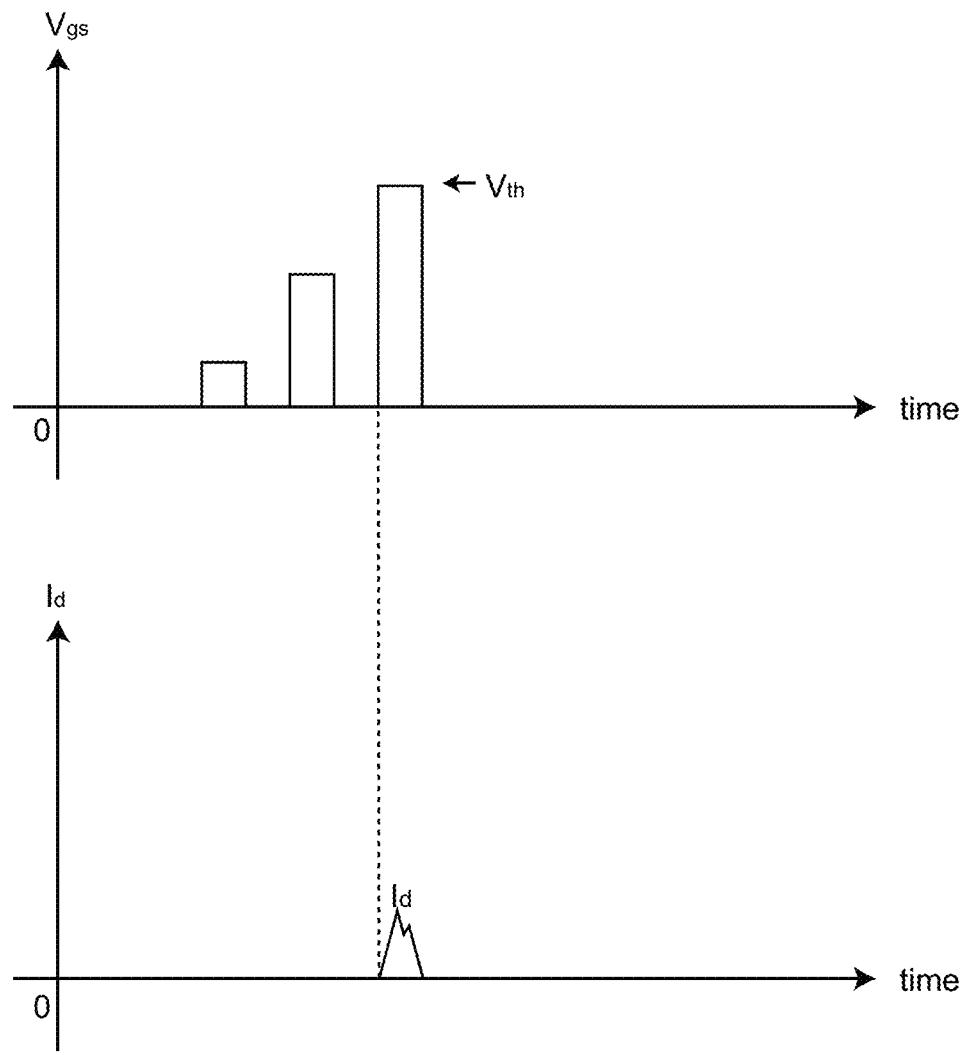
FIG. 13 is a schematic view of a graph for explaining an initial threshold voltage measurement mode (and/or a temperature characteristic measurement mode) according to a modification 2.
Figure 14:
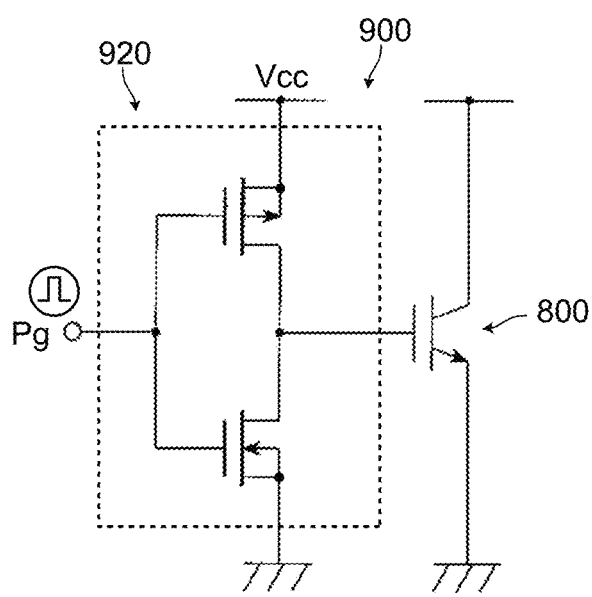
FIG. 14 is a view for explaining a conventional switching element control circuit 900.

(3) In the initial threshold voltage measurement mode in the above-mentioned embodiments 4 and 5, and in the characteristic measurement mode in the embodiment 5, the gate voltage control part 10 controls a gate voltage such that the gate voltage is increased in a step-like manner along with a lapse of time. However, the present invention is not limited to such a configuration. For example, in the initial threshold voltage measurement mode and the temperature characteristic measurement mode, the gate voltage control part 10 may control a gate voltage such that the gate voltage becomes a pulse-like voltage which is a pulse increasing an amplitude along with a lapse of time (see FIG. 13).

(4) In the above-mentioned embodiments 1, 4 and 5, the drain current characteristic of the threshold voltage of the switching element is expressed by the characteristic formula which satisfies the relationship of $Vth=Vth_0+\beta(Id-Id_0)$. However, the present invention is not limited to such a configuration. For example, information relating to a drain current characteristic of a threshold voltage of the switching element may be expressed by a (multidimensional) characteristic formula closer to an actual graph (see a solid line in FIG. 4).

(5) In the above-mentioned respective embodiments, information relating to an operation temperature/drain current characteristic of a threshold voltage of the switching element is expressed by the characteristic formula. However, the present invention is not limited to such a configuration. For example, the information relating to the operation temperature/drain current characteristic of the threshold voltage of the switching element may include data (T, Id, Vth) where the operation temperature T of the switching element, the drain current Id, and the threshold voltage Vth corresponding to the operation temperature T and the drain current Id of the switching element form a set. In such a case, when a drain current and an operation temperature at the time of operating the switching element are detected, a threshold voltage corresponding to the drain current and the operation temperature is set as a threshold voltage at the time of operating the switching element.

(6) In the above-mentioned respective embodiments, the switching element control circuit controls one switching element. However, the present invention is not limited to such a configuration. The switching element control circuit may control a plurality of switching elements.

(7) In the above-mentioned respective embodiments, the switching element is formed using a material which contains GaN. However, the present invention is not limited to such a configuration. The switching element may be formed using a material which contains a wide-gap semiconductor such as SiC or $Ga_2O_3$ or may be formed using a material which contains silicon.

(8) In the above-mentioned embodiments, a MOSFET is used as the switching element. However, the present invention is not limited to such a configuration. A switching element other than a MOSFET (for example, a HEMT, an IGBT or the like) may be used as the switching element.

(9) In the above-mentioned respective embodiments, the switching element control circuit and the switching element may be formed on separate semiconductor substrates, or the switching element control circuit and the switching element (for example, a semiconductor element having a lateral structure formed using GaN) are formed on the same semiconductor substrate.

The invention claimed is:

1. A switching element control circuit for controlling an ON/OFF operation of a switching element which includes a first electrode, a second electrode, and a third electrode, the switching element control circuit comprising:
   a third electrode voltage control part which controls a third electrode voltage for controlling the ON/OFF operation of the switching element;
   a temperature detection part which detects an operation temperature of the switching element;

a first electrode current detection part which detects a first electrode current flowing through the switching element;

a memory part which stores information including an initial threshold voltage of the switching element and information relating to an operation temperature and first electrode current characteristic of a threshold voltage of the switching element; and a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature and first electrode current characteristic of the threshold voltage of the switching element, wherein the third electrode voltage control part controls the third electrode voltage based on the threshold voltage at the time of operating the switching element calculated by the threshold voltage calculation part at the time of bringing the switching element into an ON state, the memory part further stores an initial first electrode current which flows through the switching element when the initial threshold voltage of the switching element is detected, and further stores, as the information relating to the operation temperature and first electrode current characteristic of the threshold voltage of the switching element, characteristic formulae $Vth=Vth_0+\beta(Id-Id_0)$ of the first electrode current characteristics of the threshold voltages of the switching element prepared for respective predetermined operation temperatures and corresponding to the respective operation temperatures assuming that a first electrode current coefficient of the threshold voltage is $\beta$, the threshold voltage at the time of operating the switching element is Vth, the initial threshold voltage is $Vth_0$, the first electrode current detected by the first electrode current detection part is Id, and the initial first electrode current is $Id_0$, and the threshold voltage calculation part, based on the operation temperature of the switching element detected by the temperature detection part, selects the characteristic formula $Vth=Vth_0+\beta(Id-Id_0)$ of the first electrode current characteristic of the threshold voltage of the switching element corresponding to the detected operation temperature, and calculates a threshold voltage at the time of operating the switching element based on the characteristic formula, the initial threshold voltage, the initial drain current, and the first electrode current detected by the first electrode current detection part.

2. The switching element control circuit according to claim 1, wherein the information including the initial threshold voltage and the information relating to the operation temperature and first electrode current characteristic of the threshold voltage of the switching element are stored in the memory part in advance.

3. The switching element control circuit according to claim 1, wherein the information relating to the operation temperature and first electrode current characteristic of the threshold voltage of the switching element includes data where the operation temperature of the switching element, the first electrode current, and the threshold voltage corresponding to the operation temperature and the first electrode current of the switching element, form a set.

4. The switching element control circuit according to claim 1, wherein the switching element is a MOSFET, an IGBT or a HEMT.

5. The switching element control circuit according to claim 1, wherein the switching element is formed using a material which contains GaN, SiC or $Ga_2O_3$.

6. A power module, comprising:
a switching element which includes a first electrode, a second electrode, and a third electrode; and
the switching element control circuit according to claim 1 which controls an ON/OFF operation of the switching element.

7. A switching element control circuit for controlling an ON/OFF operation of a switching element which includes a first electrode, a second electrode, and a third electrode, the switching element control circuit comprising:

a third electrode voltage control part which controls a third electrode voltage for controlling the ON/OFF operation of the switching element;

a temperature detection part which detects an operation temperature of the switching element;

a first electrode current detection part which detects a first electrode current flowing through the switching element;

a memory part which stores information including an initial threshold voltage of the switching element and information relating to an operation temperature and first electrode current characteristic of a threshold voltage of the switching element; and a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature and first electrode current characteristic of the threshold voltage of the switching element, wherein the third electrode voltage control part controls the third electrode voltage based on the threshold voltage at the time of operating the switching element calculated by the threshold voltage calculation part at the time of bringing the switching element into an ON state, the memory part further stores an initial operation temperature of the switching element when the initial threshold voltage of the switching element is detected, and further stores, as the information relating to the operation temperature and first electrode current characteristic of the threshold voltage of the switching element, characteristic formulae $Vth=Vth_0-\alpha(T-T_0)$ of temperature characteristics of the threshold voltages of the switching element prepared for respective predetermined first electrode currents and corresponding to the respective first electrode currents assuming that a temperature coefficient of the threshold voltage is $\alpha$, the threshold voltage at the time of operating the switching element is Vth, the initial threshold voltage is $Vth_0$, the operation temperature of the switching element detected by the temperature detection part is T, and the initial operation temperature is $T_0$, and the threshold voltage calculation part, based on the first electrode current detected by the first electrode current detection part, selects the characteristic formula $Vth=Vth_0-\alpha(T-T_0)$ of the temperature characteristic of the threshold voltage of the switching element corresponding to the detected first electrode current, and calculates a threshold voltage at the time of operating the switching element based on the characteristic formula, the initial threshold voltage, the initial operation temperature and the operation temperature of the switching element detected by the temperature detection part.

8. The switching element control circuit according to claim 7, wherein the information including the initial threshold voltage and the information relating to the operation temperature and first electrode current characteristic of the threshold voltage of the switching element are stored in the memory part in advance.

9. A switching element control circuit for controlling an ON/OFF operation of a switching element which includes a first electrode, a second electrode, and a third electrode, the switching element control circuit comprising:
  a third electrode voltage control part which controls a third electrode voltage for controlling the ON/OFF operation of the switching element;
  a temperature detection part which detects an operation temperature of the switching element;
  a first electrode current detection part which detects a first electrode current flowing through the switching element;
  a memory part which stores information including an initial threshold voltage of the switching element and information relating to an operation temperature and first electrode current characteristic of a threshold voltage of the switching element; and
  a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature and first electrode current characteristic of the threshold voltage of the switching element, wherein
  the third electrode voltage control part controls the third electrode voltage based on the threshold voltage at the time of operating the switching element calculated by the threshold voltage calculation part at the time of bringing the switching element into an ON state,
  the memory part further stores the initial operation temperature of the switching element and the initial first electrode current which flows through the switching element when the initial threshold voltage of the switching element is detected, and further stores, as the information relating to the operation temperature and first electrode current characteristic of the threshold voltage of the switching element, a characteristic formula which satisfies a relationship of Vth=$Vth_0$+F(T, Id) assuming that the threshold voltage at the time of operating the switching element is Vth, the initial threshold voltage is $Vth_0$, and a function for correcting a threshold voltage based on an operation temperature and a first electrode current is F(T, Id), and
  the threshold voltage calculation part calculates a threshold voltage at the time of operating the switching element based on information including the initial operation temperature, the initial first electrode current, the operation temperature T of the switching element detected by the temperature detection part and the first electrode current detected by the first electrode current detection part and the characteristic formula which satisfies the relationship of Vth=$Vth_0$+F(T, Id).

10. A switching element control circuit for controlling an ON/OFF operation of a switching element which includes a first electrode, a second electrode, and a third electrode, the switching element control circuit comprising:
  a third electrode voltage control part which controls a third electrode voltage for controlling the ON/OFF operation of the switching element;
  a temperature detection part which detects an operation temperature of the switching element;
  a first electrode current detection part which detects a first electrode current flowing through the switching element;
  a memory part which stores information including an initial threshold voltage of the switching element and information relating to an operation temperature and first electrode current characteristic of a threshold voltage of the switching element; and
  a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature and first electrode current characteristic of the threshold voltage of the switching element, wherein
  the third electrode voltage control part controls the third electrode voltage based on the threshold voltage at the time of operating the switching element calculated by the threshold voltage calculation part at the time of bringing the switching element into an ON state,
  the switching element control circuit is a switching element control circuit which performs an initial threshold voltage measurement mode where the initial threshold voltage of the switching element is measured, and a control mode where the ON/OFF operation of the switching element is controlled,
  the switching element control circuit further comprises:
    a threshold voltage measurement power source which supplies a threshold voltage measurement current to the first electrode of the switching element; and
    an ON/OFF state determination part which determines an ON/OFF state of the switching element, and
  in the initial threshold voltage measurement mode,
    the third electrode voltage control part controls the third electrode voltage such that the third electrode voltage is increased in a stepwise manner,
    the ON/OFF state determination part determines whether or not the switching element is turned on based on the first electrode current detected by the first electrode current detection part, and
    the memory part, when the ON/OFF state determination part determines that the switching element is brought into an ON state, stores the third electrode voltage applied to the third electrode as the initial threshold voltage.

11. The switching element control circuit according to claim 10, wherein
  the switching element control circuit is a switching element control circuit which further performs an operation temperature and first electrode current characteristic measurement mode where an operation temperature and first electrode current characteristic of a threshold voltage of the switching element is measured after the control mode is performed for a predetermined time, the switching element control circuit further comprises an operation temperature and first electrode current characteristic calculation part which calculates an operation temperature and first electrode current characteristic of a threshold voltage of the switching element, and in the initial threshold voltage measurement mode, the memory part, when the ON/OFF state determination part determines that the switching element is brought into an ON state, stores an operation temperature of the switching element detected by the temperature detection part as an initial operation temperature, and stores the first electrode current detected by the first electrode current detection part as an initial first electrode current, and in the operation temperature and first electrode current characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part, when the ON/OFF state determination part determines that the switching element is brought into an ON state, stores the third electrode voltage applied to the third electrode as a characteristic measurement time threshold voltage of the switching element, and the operation temperature and first electrode current characteristic calculation part calculates the operation temperature and first electrode current characteristic of the threshold voltage of the switching element based on information including the initial threshold voltage, the initial operation temperature, the initial first electrode current, the operation temperature of the switching element detected by the temperature detection part in the operation temperature and first electrode current characteristic measurement mode, the first electrode current detected by the first electrode current detection part in the operation temperature and first electrode current characteristic measurement mode, and the characteristic measurement time threshold voltage.

12. The switching element control circuit according to claim 10, wherein the third electrode voltage control part controls the third electrode voltage such that the third electrode voltage is increased in a stepwise manner along with a lapse of time in the initial threshold voltage measurement mode.

13. The switching element control circuit according to claim 10, wherein the third electrode voltage control part controls the third electrode voltage such that the third electrode voltage becomes a pulse-like voltage which is a pulse increasing an amplitude along with a lapse of time in the initial threshold voltage measurement mode.

14. A switching element control circuit for controlling an ON/OFF operation of a switching element which includes a first electrode, a second electrode, and a third electrode, the switching element control circuit comprising:

a third electrode voltage control part which controls a third electrode voltage for controlling the ON/OFF operation of the switching element;

a temperature detection part which detects an operation temperature of the switching element;

a first electrode current detection part which detects a first electrode current flowing through the switching element;

a memory part which stores information including an initial threshold voltage of the switching element and information relating to an operation temperature and first electrode current characteristic of a threshold voltage of the switching element; and a threshold voltage calculation part which calculates a threshold voltage at a time of operating the switching element based on information including the initial threshold voltage, the operation temperature of the switching element detected by the temperature detection part and the first electrode current detected by the first electrode current detection part, and the information relating to the operation temperature and first electrode current characteristic of the threshold voltage of the switching element, wherein the third electrode voltage control part controls the third electrode voltage based on the threshold voltage at the time of operating the switching element calculated by the threshold voltage calculation part at the time of bringing the switching element into an ON state, the switching element control circuit is a switching element control circuit which performs an operation temperature and first electrode current characteristic measurement mode where an operation temperature and first electrode current characteristic of a threshold voltage of the switching element is measured after a control mode where an ON/OFF operation of the switching element is controlled is performed for a predetermined time, the switching element control circuit further comprises:

a threshold voltage measurement power source which supplies a threshold voltage measurement current to the first electrode of the switching element;

an ON/OFF state determination part which determines an ON/OFF state of the switching element; and an operation temperature and first electrode current characteristic calculation part which calculates the operation temperature and first electrode current characteristic of the threshold voltage of the switching element, the memory part further stores an initial operation temperature of the switching element and an initial first electrode current, and in the operation temperature and first electrode current characteristic measurement mode, the third electrode voltage control part controls the third electrode voltage such that the third electrode voltage is increased in a stepwise manner, the ON/OFF state determination part determines whether or not the switching element is turned on based on the first electrode current detected by the first electrode current detection part, the memory part, when the ON/OFF state determination part determines that the switching element is brought into an ON state, stores an operation temperature of the switching element detected by the temperature detection part, stores the first electrode current detected by the first electrode current detection part and stores the third electrode voltage applied to the third electrode as a characteristic measurement time threshold voltage of the switching element, and the operation temperature and first electrode current characteristic calculation part calculates an operation temperature and first electrode current characteristic of a threshold voltage of the switching element based on information including the initial threshold voltage, the initial operation temperature, the initial first electrode current, the operation temperature of the switching element detected by the temperature detection part and the first electrode current detected by the first electrode current detection part in the operation temperature and first electrode current characteristic measurement mode, and the characteristic measurement time threshold voltage.

15. The switching element control circuit according to claim 14, wherein the third electrode voltage control part controls the third electrode voltage such that the third electrode voltage is increased in a stepwise manner along with a lapse of time in the operation temperature and first electrode current characteristic measurement mode.

16. The switching element control circuit according to claim 14, wherein the third electrode voltage control part controls the third electrode voltage such that the third electrode voltage becomes a pulse-like voltage which is a pulse increasing an amplitude along with a lapse of time in the operation temperature and first electrode current characteristic measurement mode.

* * * * *